United States Patent
Namuduri et al.

(10) Patent No.: US 9,726,099 B2
(45) Date of Patent: *Aug. 8, 2017

(54) ACTUATOR WITH FEED FORWARD CONTROL

(71) Applicant: GM GLOBAL TECHNOLOGY OPERATIONS LLC, Detroit, MI (US)

(72) Inventors: Chandra S. Namuduri, Troy, MI (US); Suresh Gopalakrishnan, Troy, MI (US); Thomas Wolfgang Nehl, Shelby Township, MI (US); Avoki M. Omekanda, Rochester, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 66 days.

This patent is subject to a terminal disclaimer.

(21) Appl. No.: 14/645,385

(22) Filed: Mar. 11, 2015

(65) Prior Publication Data

US 2015/0267667 A1    Sep. 24, 2015

Related U.S. Application Data

(60) Provisional application No. 61/968,039, filed on Mar. 20, 2014, provisional application No. 61/968,026,
(Continued)

(51) Int. Cl.
*F02D 41/20* (2006.01)
*F02D 41/14* (2006.01)
(Continued)

(52) U.S. Cl.
CPC ......... *F02D 41/20* (2013.01); *F02D 41/1401* (2013.01); *H03K 17/64* (2013.01);
(Continued)

(58) Field of Classification Search
CPC ...... F02D 41/20; F02D 41/28; F02D 2041/20; F02D 41/2058; F02D 2400/22; F02M 51/06; F02M 51/061
(Continued)

(56) References Cited

U.S. PATENT DOCUMENTS 5,381,297 A    1/1995   Weber
5,831,809 A   11/1998   Schmitz
(Continued)

FOREIGN PATENT DOCUMENTS

DE    3437053 C2    6/1985
DE   196 43 788 A1  5/1998
(Continued)

OTHER PUBLICATIONS

A. M. Pawlak, Transient Finite Element Modeling of Solenoid Actuators, IEEE Transactions on Magnetics, Jan. 1988, 270-273, vol. 24, No. 1.
(Continued)

*Primary Examiner* — John Kwon
*Assistant Examiner* — Johnny H Hoang

(57) ABSTRACT

An electromagnetic actuation system includes an actuator having an electrical coil, a magnetic core, and an armature. The system further includes a controllable bi-directional drive circuit for selectively driving current through the electrical coil in either of two directions. The control module provides an actuator command to the drive circuit effective to drive current through the electrical coil in a first direction to actuate the armature and in a second direction subsequent to armature actuation to oppose residual flux within the actuator. The control module includes a feed forward control module configured to adapt the actuator command to converge residual flux within the actuator to a preferred flux level.

12 Claims, 7 Drawing Sheets

Related U.S. Application Data filed on Mar. 20, 2014, provisional application No. 61/955,942, filed on Mar. 20, 2014.

(51) Int. Cl.
*H03K 17/64* (2006.01)
*F02M 51/06* (2006.01)

(52) U.S. Cl.
CPC ............... *F02D 2041/141* (2013.01); *F02D 2041/2044* (2013.01); *F02D 2041/2058* (2013.01); *F02M 51/061* (2013.01)

(58) Field of Classification Search
USPC .............. 123/90.11, 90.12, 476, 478–481; 701/102, 103
See application file for complete search history.

(56) References Cited

U.S. PATENT DOCUMENTS

| | | |
|---|---|---|
| 6,168,135 B1 | 1/2001 | Fochtman |
| 6,321,700 B1 | 11/2001 | Hein |
| 2002/0148442 A1 | 10/2002 | Fraenkle |
| 2003/0184946 A1* | 10/2003 | Kolmanovsky ........... F01L 9/04 361/160 |
| 2007/0056784 A1 | 3/2007 | Joe |
| 2007/0120332 A1 | 5/2007 | Bushko |
| 2007/0285195 A1 | 12/2007 | Nehl |
| 2008/0204178 A1* | 8/2008 | Maranville .......... F02M 57/025 335/284 |
| 2010/0018503 A1 | 1/2010 | Perry |
| 2011/0125391 A1 | 5/2011 | McAlister |
| 2012/0018262 A1 | 1/2012 | Winkler |
| 2012/0101707 A1* | 4/2012 | Kemmer ................. F02D 41/20 701/103 |
| 2012/0239278 A1* | 9/2012 | Becker ................... F02D 41/20 701/105 |
| 2012/0247428 A1* | 10/2012 | Grimminger ....... F02D 41/2438 123/472 |
| 2013/0113407 A1 | 5/2013 | Neelakantan |
| 2013/0133748 A1 | 5/2013 | Lehner |
| 2014/0069533 A1 | 3/2014 | Gorzen |
| 2014/0092516 A1 | 4/2014 | Koch |
| 2014/0110508 A1 | 4/2014 | Dames |
| 2015/0123622 A1 | 5/2015 | Yasui |
| 2015/0267660 A1 | 9/2015 | Nehl |
| 2015/0267661 A1 | 9/2015 | Namuduri |
| 2015/0267662 A1 | 9/2015 | Nehl |
| 2015/0267663 A1 | 9/2015 | Namuduri |
| 2015/0267666 A1 | 9/2015 | Gopalakrishnan |
| 2015/0267668 A1* | 9/2015 | Gopalakrishnan .. F02D 41/1401 239/585.1 |
| 2015/0267669 A1 | 9/2015 | Nehl |
| 2015/0267670 A1 | 9/2015 | Nehl |
| 2015/0285175 A1 | 10/2015 | Parrish |

FOREIGN PATENT DOCUMENTS

| | | |
|---|---|---|
| DE | 19921938 A1 | 12/1999 |
| DE | 102005042110 A1 | 3/2007 |
| DE | 10 2007 053 877 B3 | 4/2009 |
| DE | 10 2011 083 007 A1 | 3/2013 |
| DE | 102012208781 B4 | 11/2013 |
| EP | 0 074 420 A1 | 3/1983 |
| EP | 1670005 A2 | 6/2006 |
| EP | 2336544 A1 | 6/2011 |
| JP | 10-311265 A | 11/1998 |
| JP | 2007-270658 A | 10/2007 |
| KR | 10-2002-0094494 A | 12/2002 |
| WO | WO 87-01765 A1 | 3/1987 |
| WO | WO 90-02872 A1 | 3/1990 |
| WO | WO 2015 143107 A1 | 9/2015 |
| WO | WO 2015 143109 A1 | 9/2015 |
| WO | WO 2015 143116 A1 | 9/2015 |

OTHER PUBLICATIONS

T. W. Nehl, ANTIC85: A General Purpose Finite Element Package for Computer Aided Design, IEEE Transactions on Magnetics, Jan. 1988, 358-361, vol. 24, No. 1.

* cited by examiner

ACTUATOR WITH FEED FORWARD CONTROL

CROSS REFERENCE TO RELATED APPLICATIONS

This application claims the benefit of U.S. Provisional Application No. 61/968,026, filed on Mar. 20, 2014, U.S. Provisional Application No. 61/968,039, filed on Mar. 20, 2014, and U.S. Provisional Application No. 61/955,942, filed on Mar. 20, 2014, all of which are incorporated herein by reference.

TECHNICAL FIELD

This disclosure is related to solenoid-activated actuators.

BACKGROUND

The statements in this section merely provide background information related to the present disclosure. Accordingly, such statements are not intended to constitute an admission of prior art.

Solenoid actuators can be used to control fluids (liquids and gases), or for positioning or for control functions. A typical example of a solenoid actuator is the fuel injector. Fuel injectors are used to inject pressurized fuel into a manifold, an intake port, or directly into a combustion chamber of internal combustion engines. Known fuel injectors include electromagnetically-activated solenoid devices that overcome mechanical springs to open a valve located at a tip of the injector to permit fuel flow therethrough. Injector driver circuits control flow of electric current to the electromagnetically-activated solenoid devices to open and close the injectors. Injector driver circuits may operate in a peak-and-hold control configuration or a saturated switch configuration.

Fuel injectors are calibrated, with a calibration including an injector activation signal including an injector open-time, or injection duration, and a corresponding metered or delivered injected fuel mass operating at a predetermined or known fuel pressure. Injector operation may be characterized in terms of injected fuel mass per fuel injection event in relation to injection duration. Injector characterization includes metered fuel flow over a range between high flow rate associated with high-speed, high-load engine operation and low flow rate associated with engine idle conditions.

It is known for engine control to benefit from injecting a plurality of small injected fuel masses in rapid succession. Generally, when a dwell time between consecutive injection events is less than a dwell time threshold, injected fuel masses of subsequent fuel injection events often result in a larger delivered magnitude than what is desired even through equal injection durations are utilized. Accordingly, such subsequent fuel injection events can become unstable resulting in unacceptable repeatability. This undesirable occurrence is attributed to the existence of residual magnetic flux within the fuel injector that is produced by the preceding fuel injection event that offers some assistance to the immediately subsequent fuel injection event. The residual magnetic flux is produced in response to persistent eddy currents and magnetic hysteresis within the fuel injector as a result of shifting injected fuel mass rates that require different initial magnetic flux values.

SUMMARY

An electromagnetic actuation system includes an actuator having an electrical coil, a magnetic core, and an armature. The system further includes a controllable bi-directional drive circuit for selectively driving current through the electrical coil in either of two directions. The control module provides an actuator command to the drive circuit effective to drive current through the electrical coil in a first direction to actuate the armature and in a second direction subsequent to armature actuation to oppose residual flux within the actuator. The control module includes a feed forward control module configured to adapt the actuator command to converge residual flux within the actuator to a preferred flux level.

BRIEF DESCRIPTION OF THE DRAWINGS

One or more embodiments will now be described, by way of example, with reference to the accompanying drawings, in which:

FIG. 1-2 illustrates a schematic sectional view of the activation controller of FIG. 1-1, in accordance of the present disclosure;

FIG. 1-3 illustrates a schematic sectional view of an injector driver of FIGS. 1-1 and 1-2, in accordance to the present disclosure;

FIG. 2 illustrates a non-limiting exemplary first plot 1000 of measured current and fuel flow rate and a non-limiting exemplary second plot 1010 of measured main excitation coil and search coil voltages for two successive fuel injection events having identical current pulses that are separated by a dwell time that is not indicative of being closely spaced, in accordance with the present disclosure;

FIG. 3 illustrates a non-limiting exemplary first plot 1020 of measured current and fuel flow rate and a non-limiting exemplary second plot 1030 of measured main excitation coil and search coil voltages for two successive fuel injection events having identical current pulses that are separated by a dwell time that is indicative of being closely spaced, in accordance with the present disclosure;

DETAILED DESCRIPTION

This disclosure describes the concepts of the presently claimed subject matter with respect to an exemplary application to linear motion fuel injectors. However, the claimed subject matter is more broadly applicable to any linear or non-linear electromagnetic actuator that employs an electrical coil for inducing a magnetic field within a magnetic core resulting in an attractive force acting upon a movable armature. Typical examples include fluid control solenoids, gasoline or diesel or CNG fuel injectors employed on internal combustion engines and non-fluid solenoid actuators for positioning and control.

Figure 1:
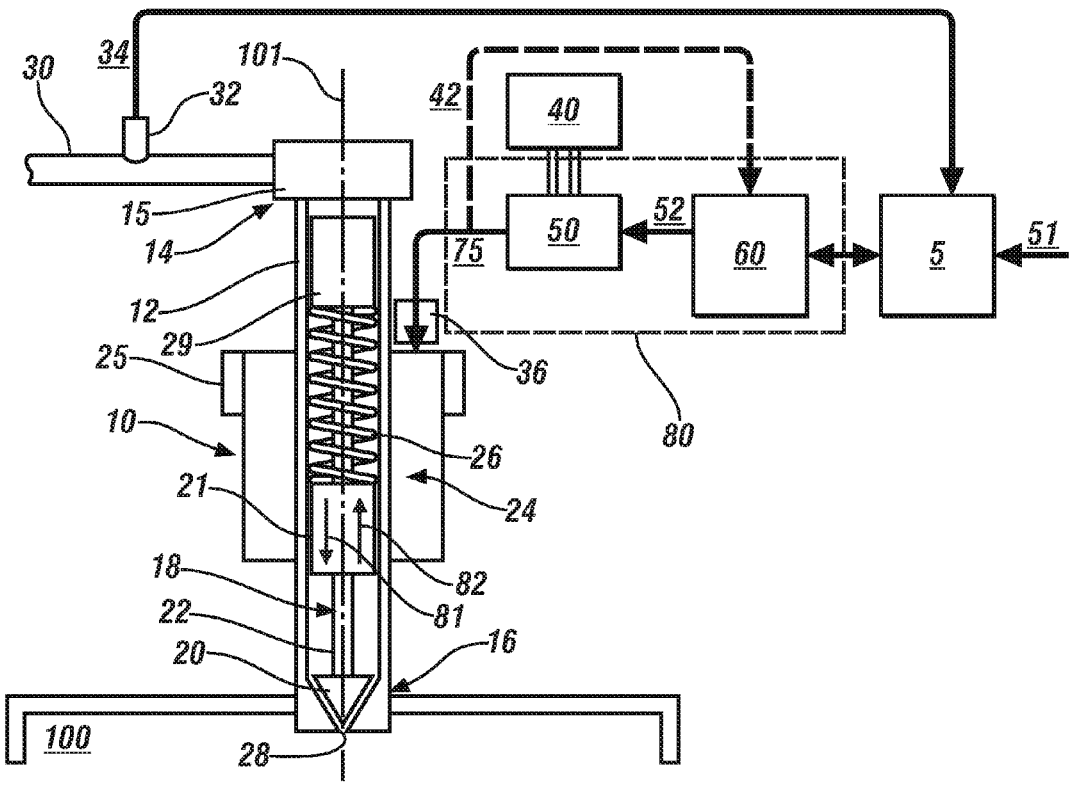
FIG. 1-1 illustrates a schematic sectional view of a fuel injector and an activation controller, in accordance with the present disclosure.

Referring now to the drawings, wherein the showings are for the purpose of illustrating certain exemplary embodiments only and not for the purpose of limiting the same, FIG. 1-1 schematically illustrates a non-limiting exemplary embodiment of an electromagnetically-activated direct-injection fuel injector 10. While an electromagnetically-activated direct-injection fuel injector is depicted in the illustrated embodiment, a port-injection fuel injector is equally applicable. The fuel injector 10 is configured to inject fuel directly into a combustion chamber 100 of an internal combustion engine. An activation controller 80 electrically operatively connects to the fuel injector 10 to control activation thereof. The activation controller 80 corresponds to only the fuel injector 10. In the illustrated embodiment, the activation controller 80 includes a control module 60 and an injector driver 50. The control module 60 electrically operatively connects to the injector driver 50 that electrically operatively connects to the fuel injector 10 to control activation thereof. Feedback signal(s) 42 may be provided from the fuel injector to the actuation controller 80. The fuel injector 10, control module 60 and injector driver 50 may be any suitable devices that are configured to operate as described herein. In the illustrated embodiment, the control module 60 includes a processing device. In one embodiment, one or more components of the activation controller 80 are integrated within a connection assembly 36 of the fuel injector 36. In another embodiment, one or more components of the activation controller 80 are integrated within a body 12 of the fuel injector 10. In even yet another embodiment, one or more components of the activation controller 80 are external to—and in close proximity with—the fuel injector 10 and electrically operatively connected to the connection assembly 36 via one or more cables and/or wires. The terms "cable" and "wire" will be used interchangeably herein to provide transmission of electrical power and/or transmission of electrical signals.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

In general, an armature is controllable to one of an actuated position and a static or rest position. The fuel injector 10 may be any suitable discrete fuel injection device that is controllable to one of an open (actuated) position and a closed (static or rest) position. In one embodiment, the fuel injector 10 includes a cylindrically-shaped hollow body 12 defining a longitudinal axis 101. A fuel inlet 15 is located at a first end 14 of the body 12 and a fuel nozzle 28 is located at a second end 16 of the body 12. The fuel inlet 15 is fluidly coupled to a high-pressure fuel line 30 that fluidly couples to a high-pressure injection pump. A valve assembly 18 is contained in the body 12, and includes a needle valve 20, a spring-activated pintle 22 and an armature portion 21. The needle valve 20 interferingly seats in the fuel nozzle 28 to control fuel flow therethrough. While the illustrated embodiment depicts a triangularly-shaped needle valve 20, other embodiments may utilize a ball. In one embodiment, the armature portion 21 is fixedly coupled to the pintle 22 and configured to linear translate as a unit with the pintle 22 and the needle valve 20 in first and second directions 81, 82, respectively. In another embodiment, the armature portion 21 may be slidably coupled to the pintle 22. For instance, the armature portion 21 may slide in the first direction 81 until being stopped by a pintle stop fixedly attached to the pintle 22. Likewise, the armature portion 21 may slide in the second direction 82 independent of the pintle 22 until contacting a pintle stop fixedly attached to the pintle 22. Upon contact with the pintle stop fixedly attached to the pintle 22, the force of the armature portion 21 causes the pintle 22 to be urged in the second direction 82 with the armature portion 21. The armature portion 21 may include protuberances to engage with various stops within the fuel injector 10.

An annular electromagnet assembly 24, including an electrical coil and magnetic core, is configured to magnetically engage the armature portion 21 of the valve assembly. The electrical coil and magnetic core assembly 24 is depicted for illustration purposes to be outside of the body of the fuel injector; however, embodiments herein are directed toward the electrical coil and magnetic core assembly 24 to be either integral to, or integrated within, the fuel injector 10. The electrical coil is wound onto the magnetic core, and includes terminals for receiving electrical current from the injector driver 50. Hereinafter, the "electrical coil and magnetic core assembly" will simply be referred to as an "electrical coil 24". When the electrical coil 24 is deactivated and de-energized, the spring 26 urges the valve assembly 18 including the needle valve 20 toward the fuel nozzle 28 in the first direction 81 to close the needle valve 20 and prevent fuel flow therethrough. When the electrical coil 24 is activated and energized, electromagnetic force (herein after "magnetic force") acts on the armature portion 21 to overcome the spring force exerted by the spring 26 and urges the valve assembly 18 in the second direction 82, moving the needle valve 20 away from the fuel nozzle 28 and permitting flow of pressurized fuel within the valve assembly 18 to flow through the fuel nozzle 28. A search coil 25 is mutually magnetically coupled to the electrical coil 24 and is preferably wound axially or radially adjacent coil 24. Search coil 25 is utilized as a sensing coil as described in further detail below.

The fuel injector 10 may include a stopper 29 that interacts with the valve assembly 18 to stop translation of the valve assembly 18 when it is urged to open. In one embodiment, a pressure sensor 32 is configured to obtain fuel pressure 34 in the high-pressure fuel line 30 proximal to the fuel injector 10, preferably upstream of the fuel injector 10. In another embodiment, a pressure sensor may be integrated within the inlet 15 of the fuel injector in lieu of the pressure sensor 32 in the fuel rail 30 or in combination with the pressure sensor. The fuel injector 10 in the illustrated embodiment of FIG. 1-1 is not limited to the spatial and geometric arrangement of the features described herein, and may include additional features and/or other spatial and geometric arrangements known in the art for operating the fuel injector 10 between open and closed positions for controlling the delivery of fuel to the engine 100.

The control module 60 generates an injector command (actuator command) signal 52 that controls the injector driver 50, which activates the fuel injector 10 to the open position for affecting a fuel injection event. In the illustrated embodiment, the control module 60 communicates with one or more external control modules such as an engine control module (ECM) 5; however, the control module 60 may be integral to the ECM in other embodiments. The injector command signal 52 correlates to a desired mass of fuel to be delivered by the fuel injector 10 during the fuel injection event. Similarly, the injector command signal 52 may correlate to a desired fuel flow rate to be delivered by the fuel injector 10 during the fuel injection event. As used herein, the term "desired injected fuel mass" refers to the desired mass of fuel to be delivered to the engine by the fuel injector 10. As used herein, the term "desired fuel flow rate" refers to the rate at which fuel is to be delivered to the engine by the fuel injector 10 for achieving the desired mass of fuel. The desired injected fuel mass can be based upon one or more monitored input parameters 51 input to the control module 60 or ECM 5. The one or more monitored input parameters 51 may include, but are not limited to, an operator torque request, manifold absolute pressure (MAP), engine speed, engine temperature, fuel temperature, and ambient temperature obtained by known methods. The injector driver 50 generates an injector activation (actuator activation) signal 75 in response to the injector command signal 52 to activate the fuel injector 10. The injector activation signal 75 controls current flow to the electrical coil 24 to generate electromagnetic force in response to the injector command signal 52. An electric power source 40 provides a source of DC electric power for the injector driver 50. In some embodiments, the DC electric power source provides low voltage, e.g., 12 V, and a boost converter may be utilized to output a high voltage, e.g., 24V to 200 V, that is supplied to the injector driver 50. When activated using the injector activation signal 75, the electromagnetic force generated by the electrical coil 24 urges the armature portion 21 in the second direction 82. When the armature portion 21 is urged in the second direction 82, the valve assembly 18 in consequently caused to urge or translate in the second direction 82 to an open position, allowing pressurized fuel to flow therethrough. The injector driver 50 controls the injector activation signal 75 to the electrical coil 24 by any suitable method, including, e.g., pulsewidth-modulate (PWM) electric power flow. The injector driver 50 is configured to control activation of the fuel injector 10 by generating suitable injector activation signals 75. In embodiments that employ a plurality of successive fuel injection events for a given engine cycle, an injector activation signal 75 that is fixed for each of the fuel injection events within the engine cycle may be generated.

The injector activation signal 75 is characterized by an injection duration and a current waveform that includes an initial peak pull-in current and a secondary hold current. The initial peak pull-in current is characterized by a steady-state ramp up to achieve a peak current, which may be selected as described herein. The initial peak pull-in current generates electromagnetic force that acts on the armature portion 21 of the valve assembly 18 to overcome the spring force and urge the valve assembly 18 in the second direction 82 to the open position, initiating flow of pressurized fuel through the fuel nozzle 28. When the initial peak pull-in current is achieved, the injector driver 50 reduces the current in the electrical coil 24 to the secondary hold current. The secondary hold current is characterized by a somewhat steady-state current that is less than the initial peak pull-in current. The secondary hold current is a current level controlled by the injector driver 50 to maintain the valve assembly 18 in the open position to continue the flow of pressurized fuel through the fuel nozzle 28. The secondary hold current is preferably indicated by a minimum current level. The injector driver 50 is configured as a bi-directional current driver capable of providing a negative current flow for drawing current from the electrical coil 24. As used herein, the term "negative current flow" refers to the direction of the current flow for energizing the electrical coil to be reversed. Accordingly, the terms "negative current flow" and "reverse current flow" are used interchangeably herein.

Embodiments herein are directed toward controlling the fuel injector for a plurality of fuel injection events that are closely-spaced during an engine cycle. As used herein, the term "closely-spaced" refers to a dwell time between each consecutive fuel injection event being less than a predetermined dwell time threshold. As used herein, the term "dwell time" refers to a period of time between an end of injection for the first fuel injection event (actuator event) and a start of injection for a corresponding second fuel injection event (actuator event) of each consecutive pair of fuel injection events. The dwell time threshold can be selected to define a period of time such that dwell times less than the dwell time threshold are indicative of producing instability and/or deviations in the magnitude of injected fuel mass delivered for each of the fuel injection events. The instability and/or deviations in the magnitude of injected fuel mass may be responsive to a presence of secondary magnetic effects. The secondary magnetic effects include persistent eddy currents and magnetic hysteresis within the fuel injector and a residual flux based thereon. The persistent eddy currents and magnetic hysteresis are present due to transitions in initial flux values between the closely-spaced fuel injection events. Accordingly, the dwell time threshold is not defined by any fixed value, and selection thereof may be based upon, but not limited to, fuel temperature, fuel injector temperature, fuel injector type, fuel pressure and fuel properties such as fuel types and fuel blends. As used herein, the term "flux" refers to magnetic flux indicating the total magnetic field generated by the electrical coil 24 and passing through the armature portion. Since the turns of the electrical coil 24 link the magnetic flux in the magnetic core, this flux can therefore be equated from the flux linkage. The flux linkage is based upon the flux density passing through the armature portion, the surface area of the armature portion adjacent to the air gap and the number of turns of the coil 24. Accordingly, the terms "flux", "magnetic flux" and "flux linkage" will be used interchangeably herein unless otherwise stated.

Figures 1, 2:
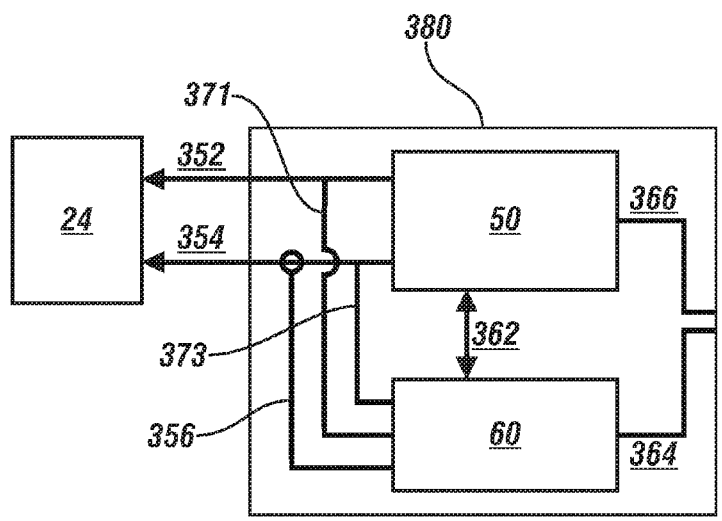

For fuel injection events that are not closely spaced, a fixed current waveform independent of dwell time may be utilized for each fuel injection event because the first fuel injection event of a consecutive pair has little influence on the delivered injected fuel mass of the second fuel injection event of the consecutive pair. However, the first fuel injection event may be prone to influence the delivered injected fuel mass of the second fuel injection event, and/or further subsequent fuel injection events, when the first and second fuel injection events are closely-spaced and a fixed current wave form is utilized. Any time a fuel injection event is influenced by one or more preceding fuel injection events of an engine cycle, the respective delivered injected fuel mass of the corresponding fuel injection event can result in an unacceptable repeatability over the course of a plurality of engine cycles and the consecutive fuel injection events are considered closely-spaced. More generally, any consecutive actuator events wherein residual flux from the preceding actuator event affects performance of the subsequent actuator event relative to a standard, for example relative to performance in the absence of residual flux, are considered closely-spaced FIG. 1-2 illustrates the activation controller 80 of FIG. 1-1, in accordance with the present disclosure. Signal flow path 362 provides communication between the control module 60 and the injector driver 50. For instance, signal flow path 362 provides the injector command signal (e.g., command signal 52 of FIG. 1-1) that controls the injector driver 50. The control module 60 further communicates with the external ECM 5 via signal flow path 364 within the activation controller 380 that is in electrical communication with a power transmission cable. For instance, signal flow path 364 may provide monitored input parameters (e.g., monitored input parameters 51 of FIG. 1-1) from the ECM 5 to the control module 60 for generating the injector command signal 52. In some embodiments, the signal flow path 364 may provide feedback fuel injector parameters (e.g., feedback signal(s) 42 of FIG. 1-1) to the ECM 5.

The injector driver 50 receives DC electric power from the power source 40 of FIG. 1-1 via a power supply flow path 366. The signal flow path 364 can be eliminated by use of a small modulation signal added to the power supply flow path 366. Using the received DC electric power, the injector driver 50 may generate injector activation signals (e.g., injector activation signals 75 of FIG. 1-1) based on the injector command signal from the control module 60.

The injector driver 50 is configured to control activation of the fuel injector 10 by generating suitable injector activation signals 75. The injector driver 50 is a bi-directional current driver providing positive current flow via a first current flow path 352 and negative current flow via a second current flow path 354 to the electrical coil 24 in response to respective injector activation signals 75. The positive current via the first current flow path 352 is provided to energize an electrical coil 24 and the negative current via the second current flow path 354 reverses current flow to draw current from the electrical coil 24. Current flow paths 352 and 354 form a closed loop; that is, a positive current into 352 results in an equal and opposite (negative) current in flow path 354, and vice versa. Signal flow path 371 can provide a voltage of the first current flow path 352 to the control module 60 and signal flow path 373 can provide a voltage of the second current flow path 354 to the control module 60. The voltage and current applied to the electrical coil 24 is based on a difference between the voltages at the signal flow paths 371 and 373. In one embodiment, the injector driver 50 utilizes open loop operation to control activation of the fuel injector 10, wherein the injector activation signals are characterized by precise predetermined current waveforms. In another embodiment, the injector driver 50 utilizes closed loop operation to control activation of the fuel injector 10, wherein the injector activation signals are based upon fuel injector parameters provided as feedback to the control module, via the signal flow paths 371 and 373. A measured current flow to the coil 24 can be provided to the control module 60, via signal flow path 356. In the illustrated embodiment, the current flow is measured by a current sensor on the second current flow path 354. The fuel injector parameters may include flux linkage, voltage and current values within the fuel injector 10 or the fuel injector parameters may include proxies used by the control module 60 to estimate flux linkage, voltage and current within the fuel injector 10.

Figures 1, 2, 3:
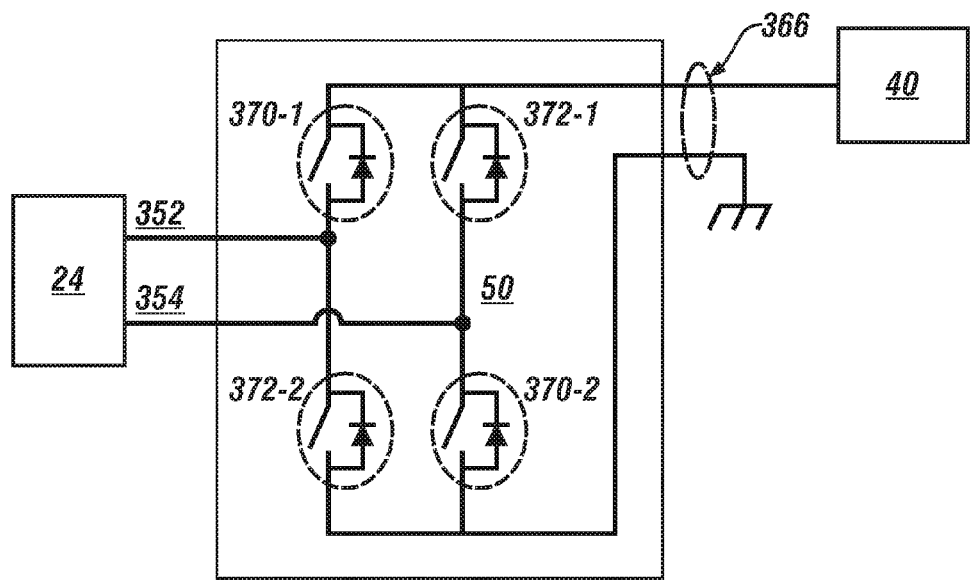
Figure 2:
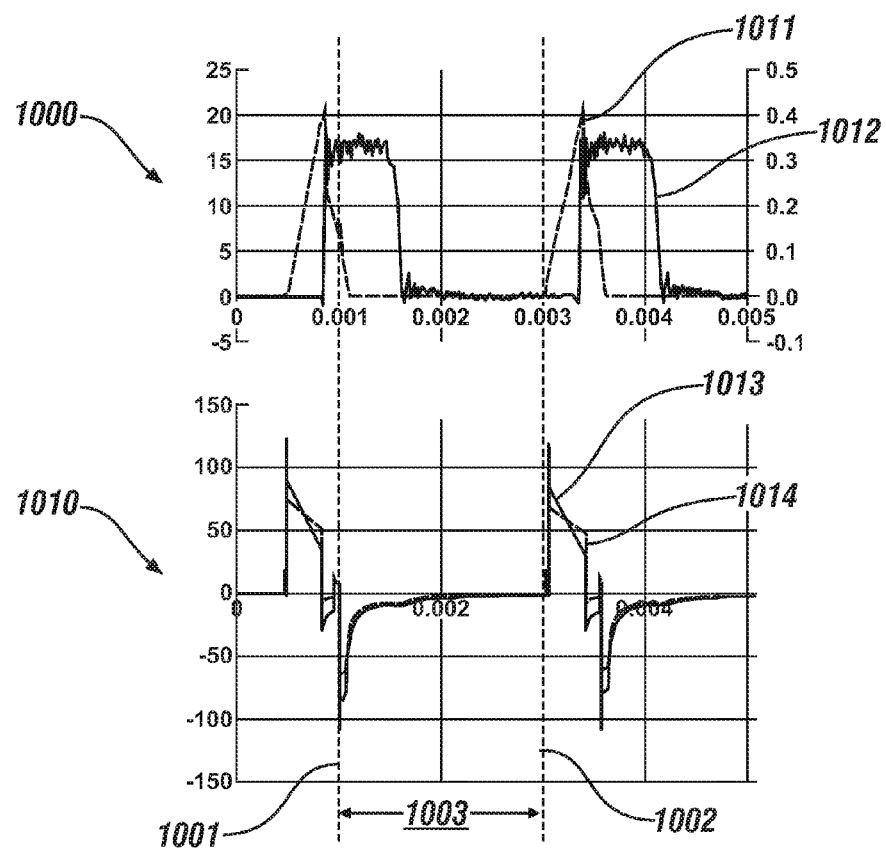
Figure 3:
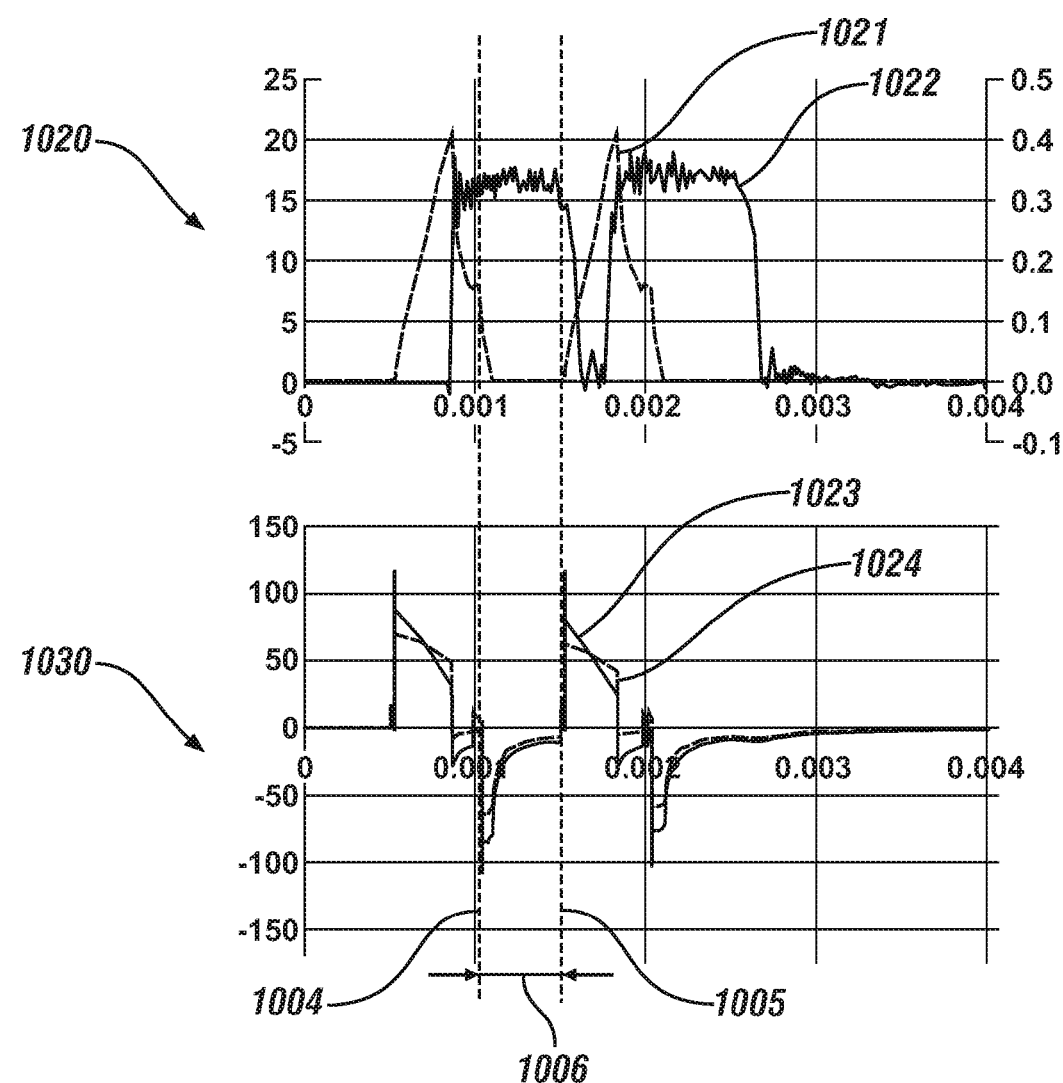

In some embodiments, the injector driver 50 is configured for full four quadrant operation. FIG. 1-3 illustrates an exemplary embodiment of the injector driver 50 of FIGS. 1-2 utilizing two switch sets 370 and 372 to control the current flow provided between the injector driver 50 and the electrical coil 24. In the illustrated embodiment, the first switch set 370 includes switch devices 370-1 and 370-2 and the second switch set 372 includes switch devices 372-1 and 372-2. The switch devices 370-1, 370-2, 372-1, 372-2 can be solid state switches and may include Silicon (Si) or wide band gap (WBG) semiconductor switches enabling high speed switching at high temperatures. The four quadrant operation of the injector driver 50 controls the direction of current flow into and out of the electrical coil 24 based upon a corresponding switch state determined by the control module 60. The control module 60 may determine a positive switch state, a negative switch state and a zero switch state and command the first and second switch sets 370 and 372 between open and closed positions based on the determined switch state. In the positive switch state, the switch devices 370-1 and 370-2 of the first switch set 370 are commanded to the closed position and the switch devices 372-1 and 372-2 of the second switch set 372 are commanded to the open position to control positive current into the first current flow path 352 and out of the second current flow path 354. These switch devices may be further modulated using pulse width modulation to control the amplitude of the current. In the negative switch state, the switch devices 370-1 and 370-2 of the first switch set 370 are commanded to the open position and the switch devices 372-1 and 372-2 of the second switch leg 372 are commanded to the closed position to control negative current into the second current flow path 354 and out of the first current flow path 352. These switch devices may be further modulated using pulse width modulation to control the amplitude of the current. In the zero switch state, all the switch devices 370-1, 370-2, 372-1, 372-2 are commanded to the open position to control no current into or out of the electromagnetic assembly. Thus, bi-directional control of current through the coil 24 may be effected.

In some embodiments, the negative current for drawing current from the electrical coil 24 is applied for a sufficient duration for reducing residual flux within the fuel injector 10 after a secondary hold current is released. In other embodiments, the negative current is applied subsequent to release of the secondary hold current but additionally only after the fuel injector has closed or actuator has returned to its static or rest position. Moreover, additional embodiments can include the switch sets 370 and 372 to be alternately switched between open and closed positions to alternate the direction of the current flow to the coil 24, including pulse width modulation control to effect current flow profiles. The utilization of two switch sets 370 and 372 allows for precise control of current flow direction and amplitude applied to the current flow paths 352 and 354 of the electrical coil 24 for multiple consecutive fuel injection events during an engine event by reducing the presence of eddy currents and magnetic hysteresis within the electrical coil 24.

FIG. 2 illustrates a non-limiting exemplary first plot 1000 of measured current and fuel flow rate and a non-limiting exemplary second plot 1010 of measured main excitation coil and search coil voltages for two successive fuel injection events having identical current pulses that are separated by a dwell time that is not indicative of being closely spaced, in accordance with the present disclosure. Dashed vertical line 1001 extending through each of plots 1000 and 1010 represents a first time whereat an end of injection for the first fuel injection event occurs and dashed vertical line 1002 represents a second time whereat a start of injection for the second fuel injection event occurs. The dwell time 1003 represents a period of time between dashed vertical lines 1001 and 1002 separating the first and second fuel injection events. In the illustrated embodiment, the dwell time exceeds a dwell time threshold. Thus, the first and second fuel injection events are not indicative of being closely-spaced.

Referring to the first plot 1000, measured current and flow rate profiles 1011, 1012, respectively, are illustrated for the two fuel injection events. The vertical y-axis along the left side of plot 1000 denotes electrical current in Amperage (A) and the vertical y-axis along the right side of plot 1000 denotes fuel flow rate in milligrams (mg) per milliseconds (ms). The measured current profile 1011 is substantially identical for each of the fuel injection events. Likewise, the measured fuel flow rate profile 1012 is substantially identical for each of the fuel injection events due to the fuel injection events not indicative of being closely-spaced.

Referring to the second plot 1010, measured main excitation coil and search coil voltage profiles 1013, 1014, respectively, are illustrated for the two fuel injection events. The measured main coil voltage may represent a measured voltage of the electrical coil 24 of FIG. 1-1 and the measured search coil voltage may represent a measured voltage of a search coil mutually magnetically coupled to the electrical coil 24 of FIG. 1-1. The vertical y-axis of plot 1010 denotes voltage (V). Accordingly, when the main excitation coil is energized, magnetic flux generated by the main excitation coil may be linked to the search coil due to the mutual magnetic coupling. The measured search coil voltage profile 1014 indicates the voltage induced in the search coil which is proportional to the rate of change of the mutual flux-linkage. The measured main excitation coil and search coil voltage profiles 1013, 1014, respectively, of plot 1010 are substantially identical for each of the first and second fuel injection events that are not indicative of being closely-spaced.

FIG. 3 illustrates a non-limiting exemplary first plot 1020 of measured current and fuel flow rate and a non-limiting exemplary second plot 1030 of measured main excitation coil and search coil voltages for two successive fuel injection events having identical current pulses that are separated by a dwell time that is indicative of being closely spaced, in accordance with the present disclosure. The horizontal x-axis in each of plots 1020 and 1030 denotes time in seconds (s). Dashed vertical line 1004 extending through each of plots 1020 and 1030 represents a first time whereat an end of injection for the first fuel injection event occurs and dashed vertical line 1005 represents a second time whereat a start of injection for the second fuel injection event occurs. The dwell time 1006 represents a period of time between dashed vertical lines 1004 and 1005 separating the first and second fuel injection events. In the illustrated embodiment, the dwell time is less than a dwell time threshold. Thus, the first and second fuel injection events are indicative of being closely-spaced.

Referring to the first plot 1020, measured current and flow rate profiles 1021, 1022, respectively, are illustrated for the two fuel injection events. The vertical y-axis along the left side of plot 1020 denotes electrical current in Amperage (A) and the vertical y-axis along the right side of plot 1020 denotes fuel flow rate in milligrams (mg) per second (s). The measured current profile 1021 is substantially identical for each of the fuel injection events. However, the measured flow rate profile 1022 illustrates a variation in the measured fuel flow rate between each of the first and second fuel injection events even though the measured current profiles are substantially identical. This variance in the measured fuel flow rate is inherent in closely-spaced fuel injection events and undesirably results in an injected fuel mass delivered at the second fuel injection event that is different than an injected fuel mass delivered at the first fuel injection event.

Referring to the second plot 1030, measured main excitation coil and search coil voltage profiles 1023, 1024, respectively, are illustrated for the two fuel injection events. The measured main coil voltage may represent a measured voltage of the electrical coil 24 of FIG. 1-1 and the measured search coil voltage may represent a measured voltage of a search coil mutually magnetically coupled to the electrical coil 24 of FIG. 1-1. The vertical y-axis of plot 1030 denotes voltage (V). Accordingly, when the main excitation coil is energized, magnetic flux generated by the main excitation coil may be linked to the search coil due to the mutual magnetic coupling. The measured search coil voltage profile 1024 indicates the voltage induced in the search coil which is proportional to the rate of change of the mutual flux-linkage. The measured main excitation coil and search coil voltage profiles 1023, 1024, respectively, of plot 1030 differ during the second injection event in comparison to the first fuel injection event. This difference is indicative of the presence of residual flux or magnetic flux when the injection events are closely-spaced. Referring to plot 1010 of FIG. 2 the measured main excitation coil and search coil voltage profiles 1013, 1014, respectively do not differ during the second injection event in comparison to the first fuel injection event when the first and second fuel injection events are not closely-spaced.

Referring back to FIG. 1-1, exemplary embodiments are further directed toward providing feedback signal(s) 42 from the fuel injector 10 back to the control module 60 and/or the injector driver 50. Discussed in greater detail below, sensor devices may be integrated within the fuel injector 10 for measuring various fuel injector parameters for obtaining the flux linkage of the electrical coil 24, voltage of the electrical coil 24 and current provided to the electrical coil 24. A current sensor may be provided on a current flow path between the activation controller 80 and the fuel injector to measure the current provided to the electrical coil or the current sensor can be integrated within the fuel injector 10 on the current flow path. The fuel injector parameters provided via feedback signal(s) 42 may include the flux linkage, voltage and current directly measured by corresponding sensor devices integrated within the fuel injector 10. Additionally or alternatively, the fuel injector parameters may include proxies provided via feedback signal(s) 42 to—and used by—the control module 60 to estimate the flux linkage, magnetic flux, the voltage, and the current within the fuel injector 10. Having feedback of the flux linkage of the electrical coil 24, the voltage of the electrical coil 24 and current provided to the electrical coil 24, the control module 60 may advantageously modify the activation signal 75 to the fuel injector 10 for multiple consecutive injection events. It will be understood that conventional fuel injectors are controlled by open loop operation based solely upon a desired current waveform obtained from look-up tables without any information related to the force producing component of the flux linkage (e.g., magnetic flux) affecting movement of the armature portion 21. As a result, conventional feed-forward fuel injectors that only account for current flow for controlling the fuel injector, and are prone to instability in consecutive fuel injection events that are closely-spaced.

It is known when the injector driver 50 only provides current uni-directionally in a positive first direction to energize the electrical coil 24, reducing the current to remain stable at zero will result in the magnetic force of the armature portion and magnetic flux within the fuel injector to gradually decay. However, the response time for the magnetic force and flux to decay is slow which often results in the presence of an undesirable level of residual flux when a subsequent consecutive fuel injection event is initiated. As aforementioned, the presence of the residual flux may impact the accuracy of the fuel flow rate and injected fuel mass to be delivered in the subsequent fuel injection event, wherein the presence of the residual flux is at an undesirable level for closely spaced fuel injection events.

Figure 4:
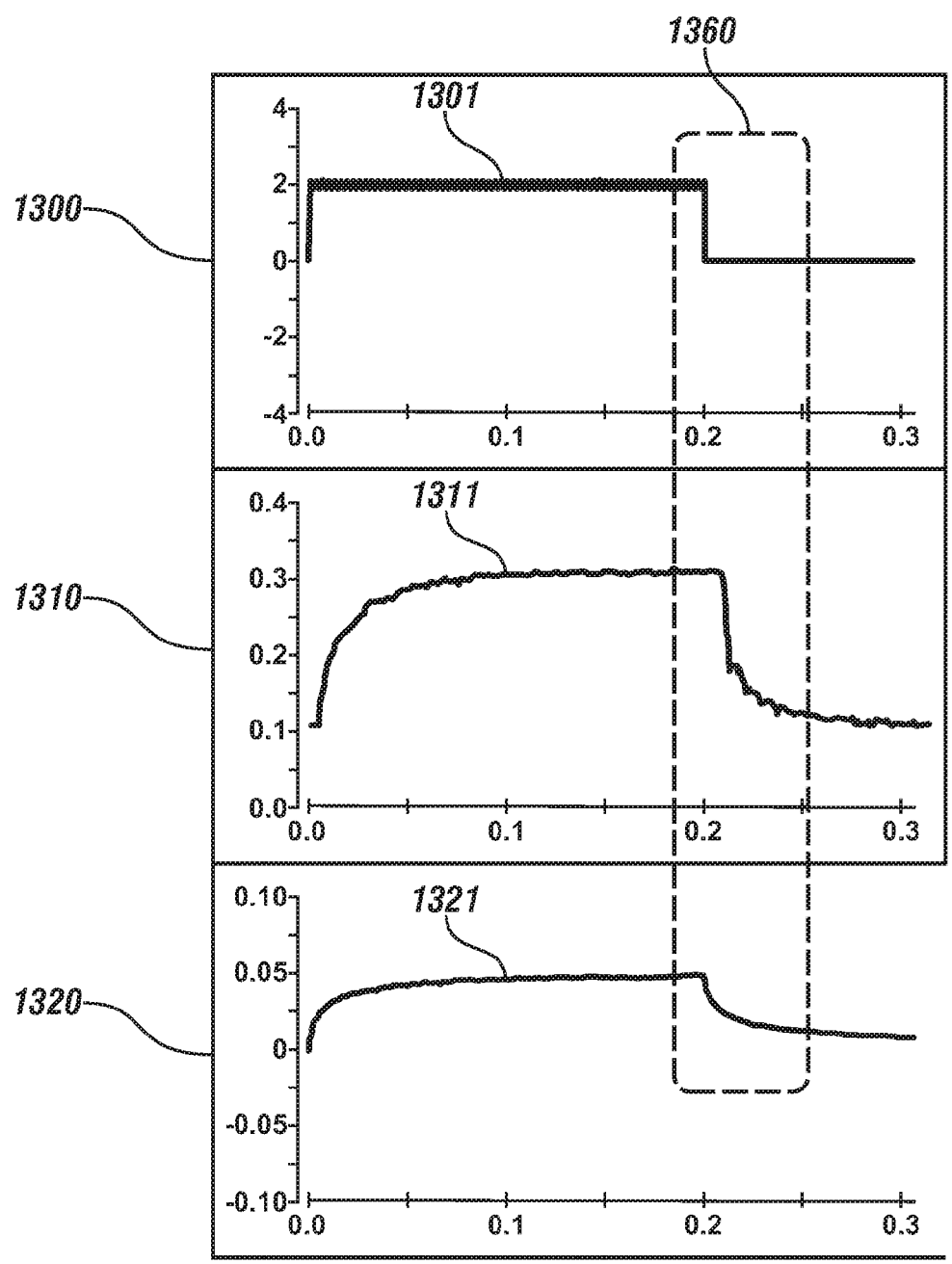
FIG. 4 illustrates a series of non-limiting exemplary plots 1300, 1310 and 1320, representing measured coil current, magnetic force and magnetic flux in a fuel injector, wherein current provided to the coil is being controlled in a unidirectional manner, in accordance with the present disclosure.

FIG. 4 illustrates a series of non-limiting exemplary plots 1300, 1310 and 1320, representing measured coil current, magnetic force and magnetic flux in a magnetic actuator, wherein current provided to the coil is being controlled in a unidirectional manner, in accordance with the present disclosure. The measured coil current is indicative of current provided uni-directionally from an injection driver to an electrical coil within the magnetic actuator. The horizontal x-axis in each of plots 1300, 1310 and 1320 denotes time in seconds (s). Plot 1300 illustrates the measured coil current having a measured current profile 1301. The vertical y-axis along the left side of plot 1300 denotes electrical current in Amperage (A). Plot 1310 illustrates the measured magnetic force having a measured magnetic force profile 1311 responsive to the measured current profile 1301, with the vertical y-axis along the left side denoting force in Newton (N). Plot 1320 illustrates the measured magnetic flux having a measured magnetic flux profile 1321, with the vertical y-axis along the left side denoting flux in weber (Wb). At region 1360 the current is reduced from a positive value to zero. In response thereto, the measured magnetic force profile 1311 is initially reduced abruptly, whereafter it slowly decays toward some value greater than zero while the measured current profile 1301 is maintained at zero. Similarly, the measured magnetic flux profile 1321 decays to a near zero value while the measured current profile 1301 is maintained at zero. Notably, magnetic flux profile 1321 illustrates a residual flux level passively attained within the actuator at zero coil current. Passive residual flux will refer to the level of steady-state residual flux within the actuator when the coil current is released to zero subsequent to an actuation event.

Bi-directional current can be utilized to improve response times of the magnetic force and flux compared to that of when current is applied uni-directionally, as described above with reference to the non-limiting exemplary plots 1300, 1310 and 1320 of FIG. 4. In addition to current driven in the positive first direction to energize an electrical coil, current driven bi-directionally also includes current driven in a reversed negative second direction to draw current from the electrical coil after an end of injection to quickly control the magnetic flux to zero.

Figure 5:
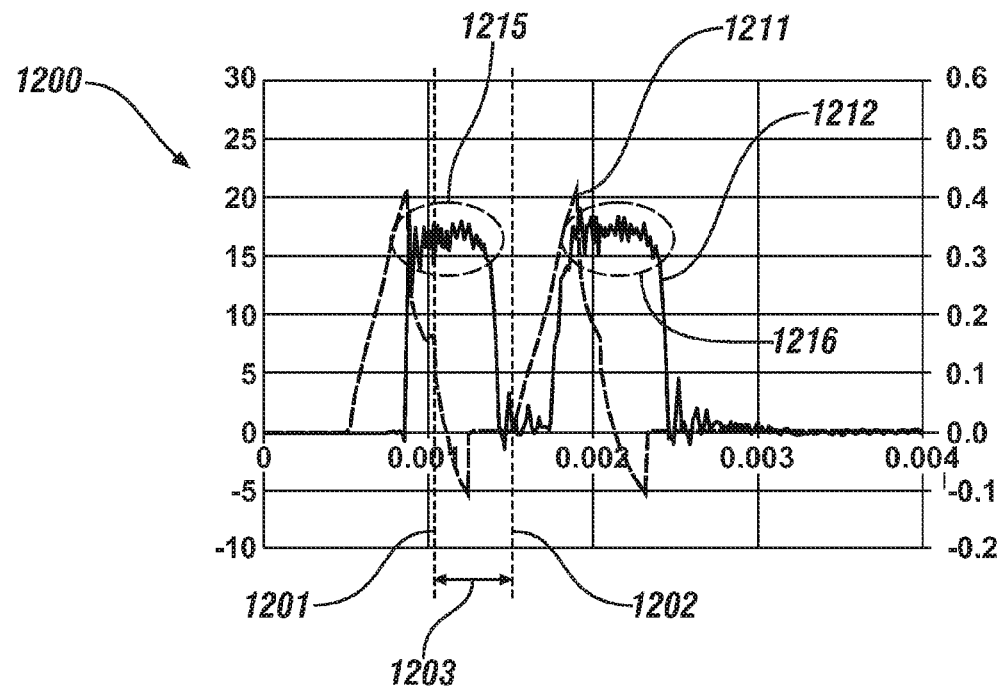
FIG. 5 illustrates a non-limiting exemplary plot of measured current and flow rate for two successive fuel injection events having identical bi-directionally applied current pulses that are separated by a dwell time that is indicative of being closely spaced, in accordance with the present disclosure.

FIG. 5 illustrates a non-limiting exemplary plot 1200 of measured current and flow rate for two successive fuel injection events having identical current pulses (e.g., waveforms) that are separated by a dwell time that is indicative of being closely spaced. Unlike the unidirectional current applied in the positive first direction in plot 1020 of FIG. 3, a bi-directional current is utilized to improve the consistency and stability of the fuel flow rate and resulting injected fuel mass delivered to the engine. The horizontal x-axis in plot 1200 denotes time in seconds (s). The vertical y-axis along the left side of plot 1200 denotes electrical current in Amperage (A) and the vertical y-axis along the right side of plot 1200 denotes fuel flow rate in milligrams (mg) per second (s). Dashed vertical line 1201 extending through plot 1200 represents a first time whereat an end of injection for the first fuel injection event occurs and dashed vertical line 1202 represents a second time whereat a start of injection for the second fuel injection event occurs. The dwell time 1203 represents a period of time between dashed vertical lines 1201 and 1202 separating the first and second fuel injection events. In the illustrated embodiment, the dwell time is less than a dwell time threshold. Thus, the first and second fuel injection events are indicative of being closely-spaced Measured current and flow rate profiles 1211, 1212, respectively, are illustrated for the two fuel injection events. The measured current profile 1211 is substantially identical for each of the fuel injection events and indicates the current provided to an electrical coil of the fuel injector. Referring to a time immediately after dashed vertical line 1201 whereat the end of injection for the first fuel injection event occurs, the measured current profile 1211 indicates that the negative current in the reversed second direction is being applied to draw current from the electrical coil. As a result of this negative current applied after the end of injection of the first injection event and prior to the start of injection for the second fuel injection event at dashed vertical line 1202, residual flux within the fuel injector is rapidly reduced to zero such that the fuel flow rate corresponding to the second fuel injection event is not influenced by the closely spaced first injection event. For instance, the measured fuel flow rate profile 1212 indicates that the measured fuel flow rate corresponding to the second fuel injection event within region 1216 is substantially identical to the measured fuel flow rate corresponding to the first fuel injection event within region 1215. This is in contrast to the strictly unidirectional current illustrated in plot 1020 of FIG. 3 that results in the second fuel injection event having a measured fuel flow rate that deviates from that of the first fuel injection event. As a result, application of the bi-directional current results in the injected fuel mass delivered at the first fuel injection event to be substantially the same as the injected fuel mass delivered at the second fuel injection event even though the fuel injection events are closely-spaced.

Assuming a negative current is driven into the coil to reduce the residual flux to below the passive residual flux level after an injection event, when the negative current is removed and goes to zero, then any residual flux still within the fuel injector would thereafter naturally decay at a certain time rate of change. However, the residual flux may be greater than desired even after its natural decay within the timeframe for another actuation. Absent a feedback mechanism which is believed to increase actuator hardware complexity and control module complexity, a need still exists to drive residual flux below the passive residual flux level to some acceptable or desired level including zero.

Figure 6:
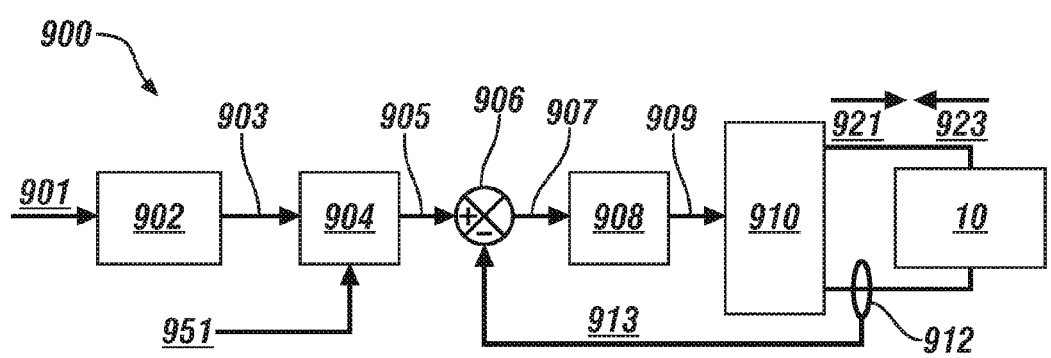
FIG. 6 illustrates an exemplary embodiment of a feed forward control module 900 using a feed forward term to apply optimum overshoot and undershoot values to a bi-directional current command for achieving consistent and stable delivery of injected fuel mass successive fuel injection events, in accordance with the present disclosure.

FIG. 6 illustrates an exemplary embodiment of a feed forward control module 900 using a feed forward term to adapt overshoot and undershoot values of a bi-directional current command for achieving the desired residual flux consistent and stable delivery of injected fuel mass across successive fuel injection events. The feed forward control module 900 can be implemented within and executed by a processing device of the control module 60 of the activation controller 80 of FIG. 1-1. Accordingly, the feed forward control module 900 will be described with reference to FIG. 1-1. The feed forward control module 900 includes a current command generation (CCG) module 902, a feed forward determinator module 904, a difference unit 906, a proportional integral (PI) control module 908, and an injector driver 910. The control module 60 and the injector driver 50 of the activation controller 80 of FIG. 1-1 may encompass different combinations of those features of the feed forward control module 900 listed.

In the illustrated embodiment, a desired injected fuel mass 901 for a corresponding fuel injection event is input to the CCG module 902. The desired injected fuel mass may be provided from an external module, e.g., the ECM 5, based on the aforementioned input parameters 51 for achieving a desired injected fuel mass, as described above with reference to FIG. 1-1. The CCG module 902 outputs a unidirectional current command 903 indicative of a commanded pull-in current and a secondary hold-current over a fuel injection event duration to activate the fuel injector 10 for delivering the desired injected fuel mass 901. The term "unidirectional" refers to the commanded pull-in and hold currents during the fuel injection event duration being in a positive first direction that includes all values for current greater than or equal to zero.

The unidirectional current command 903 is then input to the feed forward determinator module 904. The feed forward determinator module 904 applies a feed forward term to the unidirectional current command 903 to determine an optimum overshoot value to be applied thereto and an optimum undershoot value to be applied to a commanded negative current in a reversed second direction for drawing current from the electric coil 24 after the secondary hold current of the uni-directionally applied current is released to zero. Specifically, the term "overshoot" refers to a peak amplitude of the peak hold-in current (e.g., rising edge) and the term "undershoot" refers to a peak amplitude (e.g. falling edge) of the negative current in the reversed second direction prior to increasing toward zero. Accordingly, the feed forward determinator module 904 outputs a bi-directional current command 905 that includes a first portion corresponding to the unidirectional current command 903 with the optimum overshoot value and a second portion corresponding to the commanded negative current in the reversed second direction with the optimum undershoot value. As aforementioned, drawing current from the electrical coil 24 is effective to improve the response time for magnetic force and magnetic flux within the fuel injector such that consistent and stable delivery of injected fuel masses are delivered for successive fuel injection events.

Preferably, the feed forward term of the feed forward determinator module 904 includes a transfer function having coefficients adjustable based upon operating parameter(s) 951 of the fuel injector that include, but are not limited to, temperature of the fuel injector, operating voltage, the desired injected fuel mass to be delivered. The operating parameters of the fuel injector may be obtained by any method(s). The operating parameter(s) 951 may be provided from an external module, e.g., the ECM 5, based on the aforementioned input parameters 51 as described above with reference to FIG. 1-1. In some embodiments, the feed forward term may include a transfer function wherein the coefficients are selected such that the resulting overshoot and undershoot of the applied current in the positive first and negative second directions, respectively, result in desired values of residual flux and reduced magnetic force response times. It will be understood that the selected coefficients are adjustable and tunable during ongoing operation over the life of the fuel injector 10 since they are based upon operating parameter(s) 951 of the fuel injector. An exemplary transfer function can be expressed by the following relationship:

$$H(s) = \frac{a_1 s + 1}{a_2 s + 1} \quad [1]$$

wherein s is a Laplace operator, and
$a_1$ and $a_2$ are polynomial coefficients.

The bi-directional current command 905 output from the feed forward determinator module 904 does not account for electrical current present within the fuel injector, e.g., flowing through the electrical coil. The bi-directional current command 905 is thereby input to the difference unit 906 and compared with current feedback 913 from the fuel injector 10. In the illustrated embodiment the current feedback 913 indicates current measured by a current sensor 912 positioned on a current flow path between the fuel injector 10 and the injector driver 910. In some embodiments, the current sensor 912 may be integrated within the fuel injector 10. The difference unit 906 outputs an adjusted bi-directional current command 907 based on a comparison between the bi-directional current command 905 and the current feedback 913 measured by the current sensor 912.

The adjusted current command 907 is input to the PI control module 908 whereby a commanded PWM electric power flow signal 909 is generated and input to the injector driver 910. Based upon the commanded PWM electric power flow signal 909, which accounts for the current feedback 913 within the fuel injector 10, the injector driver 910 may bi-directionally apply current both in the positive first direction 921 for energizing the electrical coil 24 for activating the fuel injector 10 to deliver the desired fuel flow rate 901 and the negative second direction 923 for drawing current from the electrical coil 24 at optimal undershoot after the fuel injection event to remove the presence of residual flux and improve the response time of the magnetic force.

Figure 7:
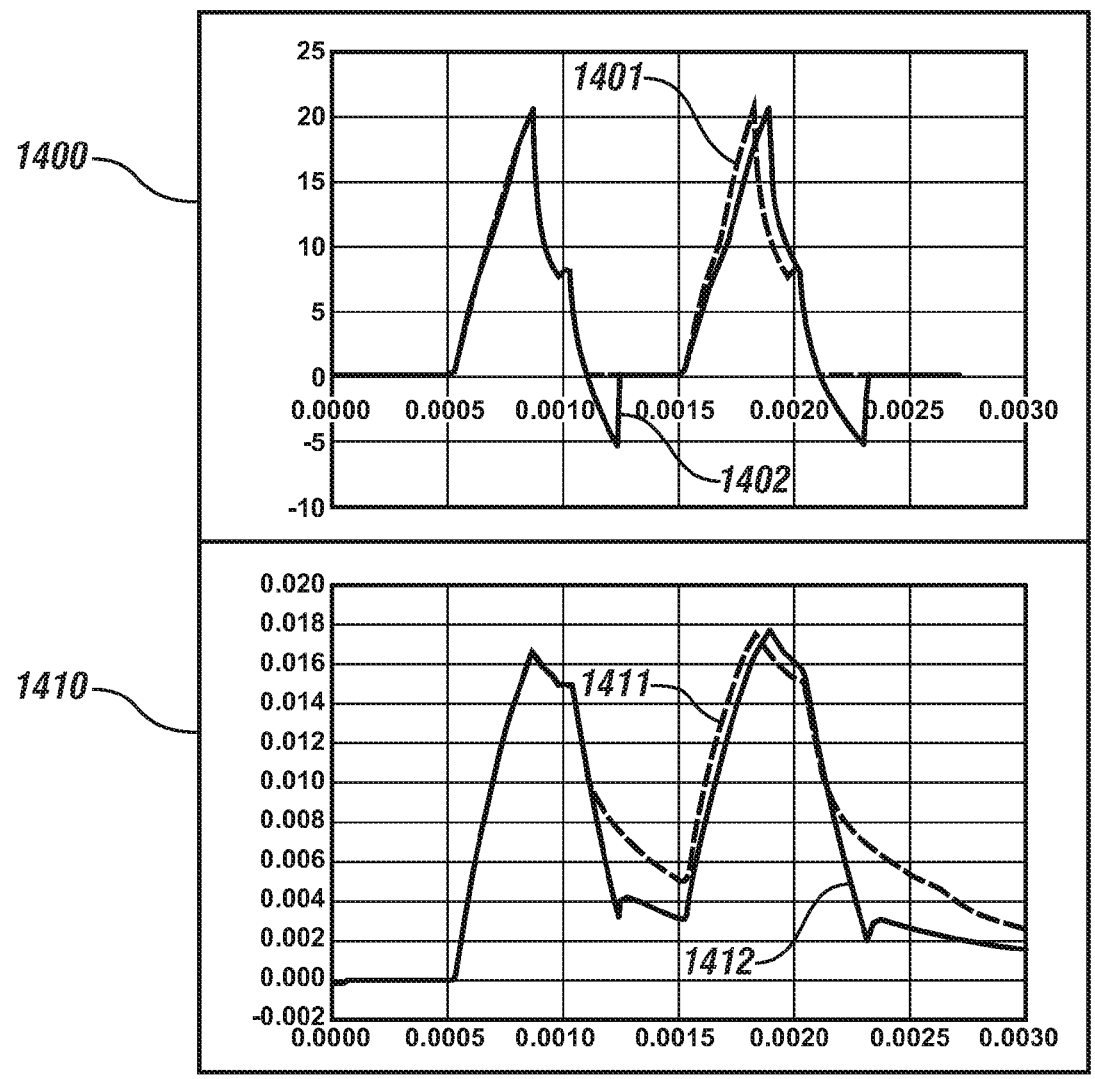
FIG. 7 illustrates non-limiting exemplary plots 1400 and 1410 representing measured current and measured magnetic flux, respectively, within a fuel injector for two successive fuel injection events, in accordance with the present disclosure.

FIG. 7 illustrates non-limiting exemplary plots 1400 and 1410 representing measured current and measured magnetic flux, respectively, within a fuel injector for two successive fuel injection events. The horizontal x-axis in each of the plots 1400 and 1410 denotes time in seconds (s). Referring to plot 1400, the vertical y-axis denotes electrical current in Amperage (A). Profile line 1401 indicates a uni-directionally applied measured current to an electrical coil of the fuel injector and profile line 1402 indicates a bi-directionally applied measured current to the electrical coil for each of the fuel injection events. The uni-directionally applied measured current indicated by profile line 1401 is controlled to zero at the end of each of the fuel injection events. The bi-directionally applied measured current indicated by profile line 1402 is first reduced to zero, and then the current is driven in a reversed negative direction at the end of each of the fuel injection events. The bi-directionally applied measured current may include optimum overshoot and undershoot values based upon a feed forward term such as a transfer function applied to a commanded current, as described above with reference to the feed forward control module 900 of FIG. 9.

Referring to plot 1410, the vertical y-axis denotes magnetic flux in weber (Wb). Profile line 1411 indicates the measured magnetic flux within the fuel injector responsive to the uni-directionally applied measured current indicated by the profile line 1401 of plot 1400. Profile line 1412 indicates the measured magnetic flux within the fuel injector responsive to the bi-directionally-applied measured current indicated by the profile line 1402 of plot 1400. Responsive to the uni-directionally applied measured current indicated by the profile line 1401 of plot 1400 being reduced to—and maintaining—zero at the end of the fuel injection events, the profile line 1411 of plot 1410 illustrates the measured magnetic flux being reduced. However, the measured magnetic flux indicated by the profile line 1412 experiences a faster reduction of the residual flux in response to the bi-directionally applied measured current indicated by the profile line 1402 of plot 1400 driven in the reversed negative direction and having optimum undershoot and overshoot values.

Figure 8:
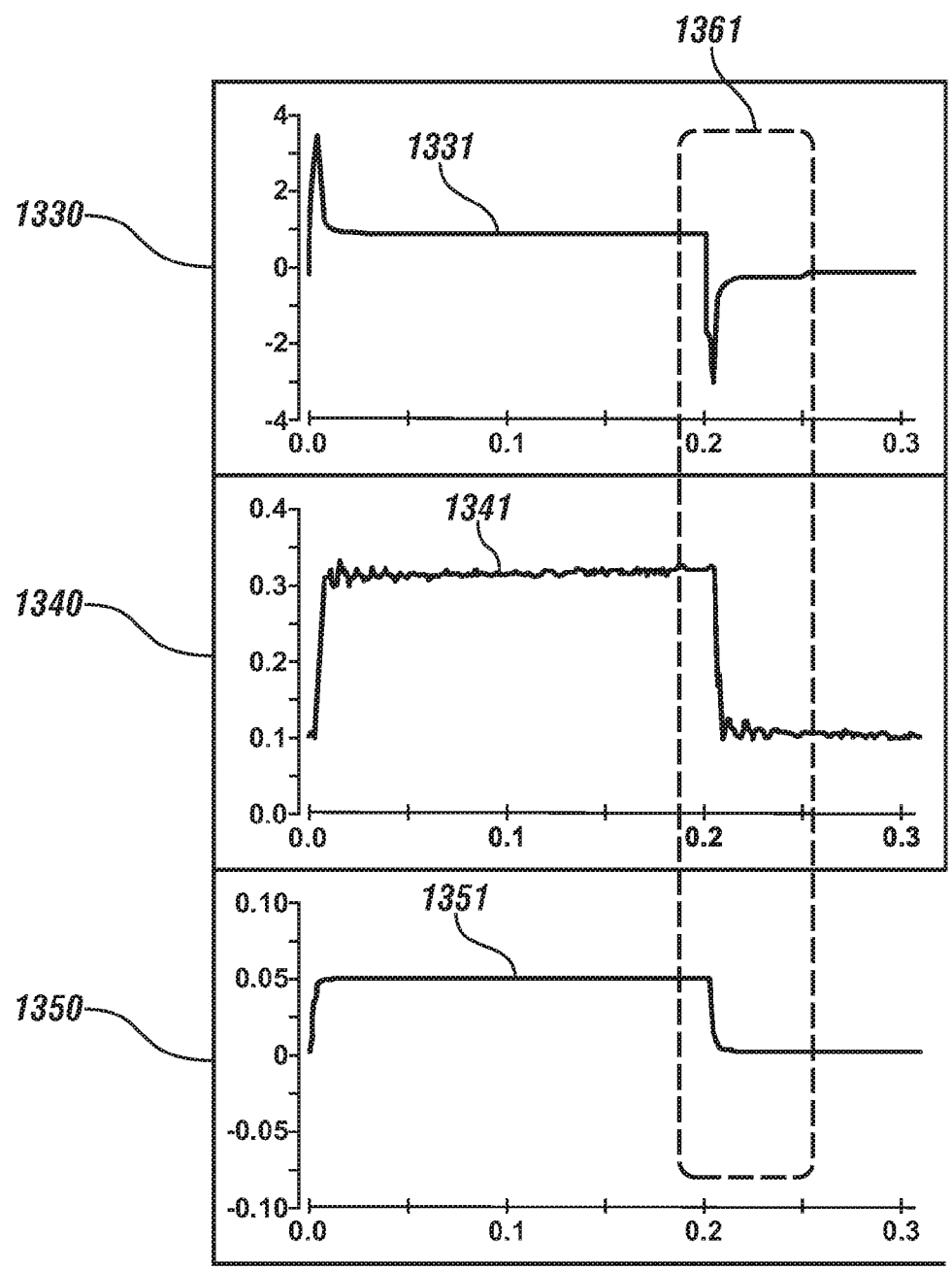
FIG. 8 illustrates a series of non-limiting exemplary plots 1330, 1340 and 1350, representing measured coil current, magnetic force and magnetic flux in a fuel injector, wherein flux is controlled using current applied to the fuel injector in a bi-directional manner, in accordance with the present disclosure.

FIG. 8 illustrates a series of non-limiting exemplary plots 1330, 1340 and 1350, representing measured coil current, magnetic force and magnetic flux in a magnetic actuator wherein flux is controlled using current applied to the fuel injector in a bi-directional manner. For instance, the flux may be controlled using the feed forward control module 900 of FIG. 6 to bi-directionally apply the current to the magnetic actuator. The measured coil current is indicative of current provided bi-directionally from a coil driver to an electromagnetic coil of the magnetic actuator. The horizontal x-axis in each of plots 1330, 1340 and 1350 denotes time in seconds (s). Plot 1330 illustrates a measured coil current having a measured current profile 1331. The vertical y-axis along the left side of plot 1330 denotes electrical current in Amperage (A). Plot 1340 illustrates the measured magnetic force having a measured magnetic force profile 1341 responsive to the measured current profile 1331, with the vertical y-axis along the left side denoting force in Newtons (N). Plot 1350 illustrates the measured magnetic flux having a measured magnetic flux profile 1351 responsive to the measured current profile 1331, with the vertical y-axis along the left side denoting flux in weber (Wb). At region 1361 the measured current in a positive direction is reduced from a positive value until zero and then the current is driven in a reversed negative direction to a value less than zero for an optimum duration. In response to the current driven in the reversed negative direction, the measured magnetic force profile 1341 is abruptly reduced to a desired value and the measured magnetic flux profile 1351 is abruptly reduced to zero. Accordingly, when the current is applied to the electromagnetic coil in the reversed negative direction, current is being drawn from the electromagnetic coil to directly control the magnetic flux to a level below the passive residual flux level, preferable to zero, and the magnetic force to reach consummately lower values in response times much quicker than those illustrated in the non-limiting exemplary plots 1300, 1310 and 1320 of FIG. 4 when the current is merely reduced to and maintained at zero and not driven in the negative second direction.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. An electromagnetic actuation system, comprising:
   an actuator comprising an electrical coil, a magnetic core, and an armature;
   a controllable bi-directional drive circuit for selectively driving current through the electrical coil in either of two directions; and
   a control module providing an actuator command to the drive circuit effective to drive current through the electrical coil in a first direction to actuate the armature and in a second direction subsequent to armature actuation to oppose residual flux within the actuator, said control module comprising a feed forward control module configured to adapt said actuator command to converge residual flux within the actuator to a preferred flux level.

2. The electromagnetic actuation system of claim 1, wherein said preferred flux level comprises a zero flux level.

3. The electromagnetic actuation system of claim 1, wherein said preferred flux level comprises a non-zero flux level having a magnitude that is less than the magnitude of a level of residual flux passively attained within the electrical coil at zero current.

4. The electromagnetic actuation system of claim 1, wherein said feedforward control module comprises a feed-forward determinator module responsive to at least one operating parameter of a system that is responsive to actuation of the actuator.

5. The electromagnetic actuation system of claim 1, wherein said feedforward control module is configured to establish an overshoot component and an undershoot component of said actuator command.

6. The electromagnetic actuation system of claim 4, wherein said feedforward determinator module comprises a transfer function in accordance with the following relationship:

$$H(s) = \frac{a_1 s + 1}{a_2 s + 1}$$

wherein s is a Laplace operator, and
   $a_1$ and $a_2$ are polynomial coefficients.

7. A method for controlling an electromagnetic actuator, comprising:
   driving current though an electrical coil of the actuator in a first direction when an actuation is desired; and,
   when the actuation is not desired driving current through the electrical coil in a second direction sufficient to reduce residual flux within the actuator below a level passively attained within the actuator at zero coil current, wherein driving current through the electrical coil in the second direction comprises adapting the current through the electrical coil based upon at least one operating parameter of a system that is responsive to actuation of the actuator.

8. The method for controlling the electromagnetic actuator of claim 7, further comprising:
adapting the current through the electrical coil based upon an electrical coil current feedback to converge electrical coil current to a desired electrical coil current.

9. A system for controlling actuation of the fuel injector, comprising:
a fuel injector comprising an electrical coil, a magnetic core, and an armature;
a controllable bi-directional drive circuit responsive to a current command for driving current through the electrical coil in a first direction to actuate the armature, in a second direction subsequent to armature actuation, and thereafter to zero; and
a feed forward control module configured to determine a preferred overshoot component and a preferred undershoot component of said current command and adapt the current command based on the preferred overshoot and undershoot components.

10. The system for controlling actuation of the fuel injector of claim 9, wherein said feedforward control module is further configured to determine the current through the electrical coil and adapt the current command based on the current through the electrical coil.

11. The system for controlling actuation of the fuel injector of claim 9, wherein said feedforward control module comprises a feedforward determinator module responsive to at least one operating parameter of a system responsive to actuation of the fuel injector.

12. The system for controlling actuation of the fuel injector of claim 11, wherein said feedforward determinator module comprises a transfer function in accordance with the following relationship:

$$H(s) = \frac{a_1 s + 1}{a_2 s + 1}$$

wherein s is a Laplace operator, and
$a_1$ and $a_2$ are polynomial coefficients.

* * * * *